United States Patent [19]

Houldsworth

[11] 4,160,950
[45] Jul. 10, 1979

[54] CURRENT MEASURING APPARATUS

[75] Inventor: John A. Houldsworth, Croydon, England

[73] Assignee: U.S. Philips Corporation, New York, N.Y.

[21] Appl. No.: 794,404

[22] Filed: May 6, 1977

[30] Foreign Application Priority Data

May 10, 1976 [GB] United Kingdom ............... 19111/76

[51] Int. Cl.² ..................... G01R 19/00; G01R 33/00; G01R 19/22
[52] U.S. Cl. ................................ 324/107; 324/117 H; 324/119
[58] Field of Search ............... 324/107, 117 H, 117 R, 324/126, 127, 140 R, 142, 119; 361/93; 340/664

[56] References Cited

U.S. PATENT DOCUMENTS

| 851,149 | 4/1907 | Woodbridge et al. | ............... 324/127 |
| 1,257,514 | 2/1918 | Meyer | ................................... 324/126 |

FOREIGN PATENT DOCUMENTS

| 373058 | 12/1921 | Fed. Rep. of Germany | ........... 324/119 |
| 1014646 | 8/1957 | Fed. Rep. of Germany | ...... 324/117 H |
| 682187 | 9/1929 | France | .................................... 324/119 |

Primary Examiner—Rudolph V. Rolinec
Assistant Examiner—Ernest F. Karlsen
Attorney, Agent, or Firm—Thomas A. Briody; William J. Streeter; Bernard Franzblau

[57] ABSTRACT

A current measuring apparatus for polyphase current wherein reverse poled parallel diodes in each of the polyphase lines provide separate direct current paths for the alternate half cycles of the polyphase current. Alternate half cycles having like polarity of each phase are summed using the magnetic field created by the current components and a Hall-effect device.

4 Claims, 1 Drawing Figure

U.S. Patent Jul. 10, 1979 4,160,950
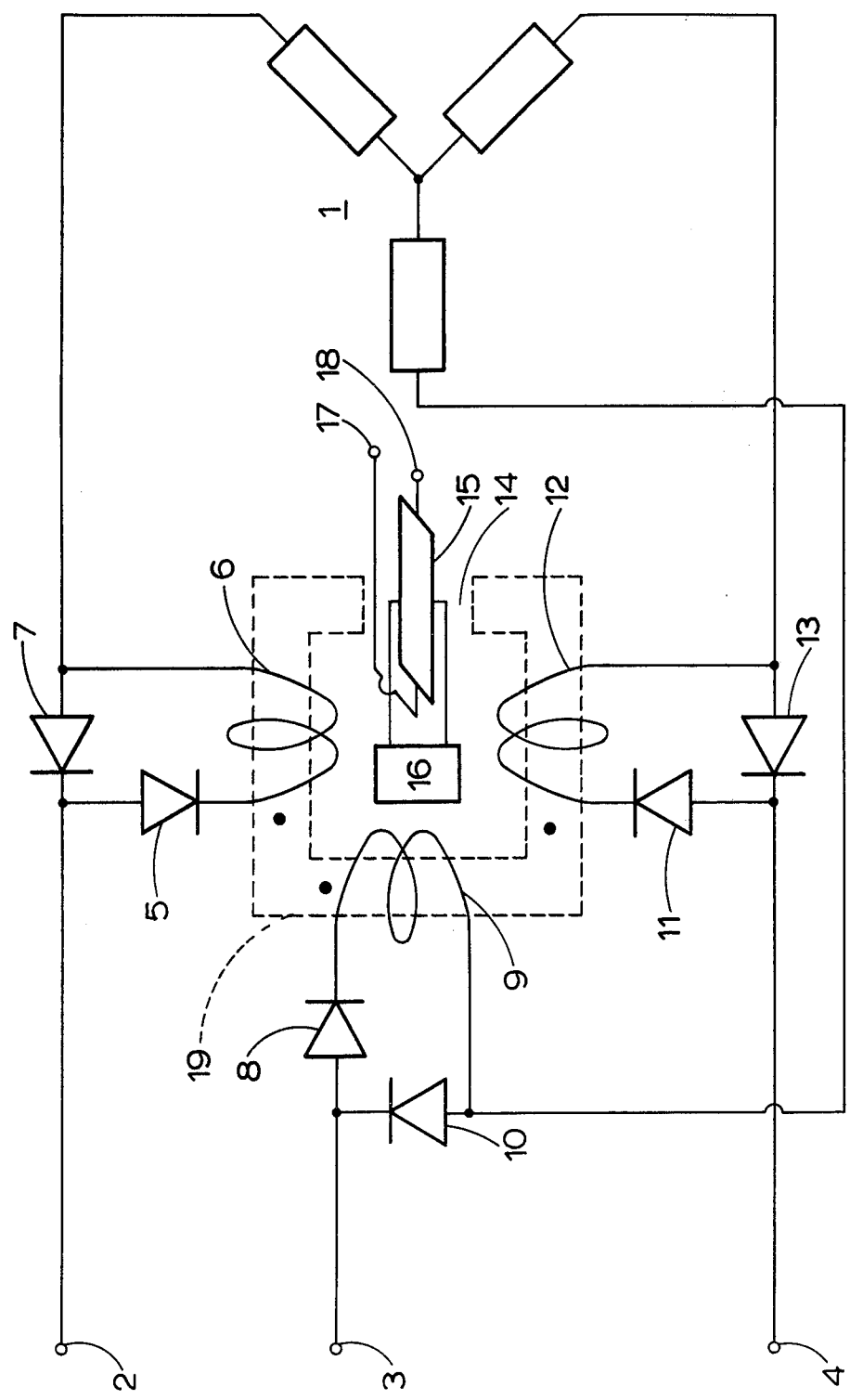

CURRENT MEASURING APPARATUS

This invention relates to apparatus for producing a signal whose average value is representative of a current in an a.c. electrical supply.

It is known to use a Hall element to produce an output voltage proportional to current in an electric circuit by positioning the Hall element in a magnetic circuit which is provided with an energizing winding. If the current is passed through the energizing winding and the Hall element is supplied with a steady current, a Hall voltage which is proportional to the magnetic field at the element, and hence to the current flowing through the energizing winding, will be set up at the Hall element. Such an arrangement can provide electrical isolation between the input current and the output voltage, which is sometimes an advantage.

It is sometimes required to produce a signal the average value of which is representative of the sum of the moduli of the currents flowing in the conductors of a polyphase electrical supply to a load, and it is an object of the invention to provide apparatus by which this can be done.

The invention provides apparatus for producing a signal whose average value is representative of the sum of the moduli of the currents flowing in the conductors of a polyphase electrical supply to a load. The apparatus comprises a magnetic circuit in which is positioned a magneto-sensitive device, an individual energizing conductor for said magnetic circuit corresponding to each said conductor of the supply, and rectifier means for feeding each said energizing conductor with a unidirectional current which is a measure of the current flowing in the corresponding conductor of the supply in a given direction relative to the load. The given direction is the same for all of said conductors of the supply, said unidirectional currents having polarities relative to the corresponding conductors such that the magnetic fields which are produced in the magnetic circuit will all have the same sense and will thus assist each other.

Such an arrangement can provide electrical isolation both between the various energising conductors themselves and between each said energising conductor and the output signal (which may be produced by a Hall element. If the load is balanced three-phase and each energizing conductor is in the form of a winding on a common yoke of magnetic material, construction of these windings to be substantially identical can result in substantially identical contributions from each to the output signal. This can be an advantage compared with conventional methods of producing a signal whose average value is representative of the moduli of the currents flowing in the conductors of a polyphase supply, in which it is often difficult to correctly balance the various contributions.

It is, of course, necessary to provide rectifier means to supply each energizing conductor with an unidirectional current because the algebraic sum of the currents in the phase conductors of a polyphase supply is at all times zero. (assuming there is no neutral connection).

An embodiment of the invention will now be described, by way of example, with reference to the sole FIGURE of the accompanying diagrammatic drawing.

In the drawing a three-phase load 1, for example an asynchronous electric motor, is supplied from terminals 2, 3 and 4 of a three-phase electrical supply. The series combination of a rectifier 5 and a winding 6, which series combination is shunted by an oppositely poled rectifier 7, is included in the connection between the terminal 2 and the load 1. Similarly the series combination of a rectifier 8 and a winding 9, which series combination is shunted by an oppositely poled rectifier 10, is included in the connection between the terminal 3 and the load 1, and the series combination of a rectifier 11 and a winding 12, which series combination is shunted by an oppositely poled rectifier 13, is included in the connection between the terminal 4 and the load 1. Windings 6, 9 and 12 are identical and are wound on a yoke or core 19 of magnetic material, for example a ferrite. They constitute energizing windings for the magnetic circuit defined by the yoke 19, which circuit has a gap 14 in which is situated a Hall element 15. Element 15 is provided with a steady operating current from a source 16 and has Hall voltage output terminals 17 and 18.

It will be seen that currents flowing in the conventional direction from terminals 2, 3 and 4 to the load 1 will flow through the series combinations 5 and 6, 8 and 9, and 11 and 12 respectively, whereas currents flowing in the opposite direction will flow through rectifiers 7, 10 and 13 respectively. Thus each pair of rectifiers 5 and 7, 8 and 10, 11 and 13 causes the corresponding windings 6, 9 or 12 to be supplied with a unidirectional current which is equal to the current flowing from the corresponding terminal 2, 3 or 4 to the load 1.

The windings 6, 9 and 12 (which may in practice be concentric) are wound in a sense such that the resulting magnetic fields produced thereby in the yoke 19, and hence at the Hall element 15, all have the same sense and thus assist one another. Element 15 thus experiences a magnetic field the average value of which is a measure of the sum of the moduli of the currents flowing in the conductors connecting the terminals 2, 3 and 4 to the load 1. Because a "three-wire" load is used with a three phase supply all possible currents are detected; any current flowing through the rectifier 7 at any time is matched by a corresponding current or currents flowing through the series combination 8, 9 and/or the series combination 11, 12, and a similar situation exists with any currents flowing through the rectifiers 10 and 13. The average value of the Hall voltage appearing across terminals 17 and 18, the ripple frequency of which is six times the supply frequency; is therefore also a measure of the sum of the moduli of said currents.

If desired, Hall element 15 may be replaced by a magneto-sensitive element of another kind, for example a magneto-resistive element.

It will be evident that a similar arrangement may be used when the number of phases of the polyphase supply is different from three, the number of windings on the yoke 19 and their associated pairs of rectifiers at all times being chosen to match the number of supply conductors the current in which it is desired to measure.

The number of turns in each winding will, of course, be chosen to obtain the sensitivity required with the apparatus. Provision of an excessive number of turns will not normally be desirable in view of the series inductance inevitably produced thereby (although the presence of the air gap 14 will make the series inductance smaller than it would otherwise be).

The rectifiers 7, 10 and 13 may be replaced by low-value resistors, if desired.

The star-connected load 1 may of course be replaced by a delta-connected load if desired.

What we claim is:

1. Apparatus for producing a signal whose average value is representative of the sum of the currents flowing in the conductors of a polyphase electrical supply to a load, comprising a plurality of line conductors coupling the polyphase electric supply to the load, a core forming a magnetic circuit in which is positioned a Hall-effect magnetosensitive device, an individual energizing conductor magnetically coupled to the core of the magnetic circuit corresponding to each said line conductor of the polyphase supply, and a rectifier means in series with each of the line conductors, said rectifier means comprising a first rectifier element in series with a corresponding energizing conductor and a second rectifier element in parallel with the resulting series combination of the first rectifier element and the energizing conductor, the second rectifier element being oppositely poled to the corresponding first rectifier element, said rectifier means supplying each said energizing conductor with a unidirectional current which is a measure of the current flowing in the corresponding line conductor of the supply in a given direction relative to the load, which given direction is the same for all said line conductors of the polyphase supply, said unidirectional currents having polarities with respect to the corresponding energizing conductors such that the magnetic fields which are produced in the magnetic circuit will all have the same sense.

2. Apparatus as claimed in claim 1 wherein each energizing conductor comprises a winding wound on a common core of magnetic material having an air gap in which said Hall device is located, said windings being substantially identical.

3. Apparatus for producing an output signal which represents the sum of the currents flowing in the line conductors which connect a polyphase AC voltage source to a load comprising, a core forming a magnetic circuit, a Hall-effect magnetosensitive device magnetically coupled to the core of the magnetic circuit and responsive thereto to derive said output signal, a plurality of line conductors connecting the polyphase source to the load, a plurality of energizing conductors magnetically coupled to the core of the magnetic circuit, one energizing conductor corresponding to each line conductor, and a plurality of rectifier means, one for each of the line conductors, for coupling the polyphase source to the load and to the energizing conductors so that the load receives a polyphase AC current and the energizing conductors each receive a unidirectional current indicative of the current flow in a corresponding line conductor in a given direction relative to the load, said given direction being the same for each of said line conductors of the polyphase source, each of said rectifier means comprising a first rectifier element connected in series with a respective line conductor between the polyphase source and the load and a second rectifier element connected in series with an energizing conductor, the series combination of the second rectifier element and the energizing conductor being connected in parallel with a respective first rectifier element and with the first and second rectifier elements oppositely polarized relative to the polyphase source, the rectifier means polarizing the unidirectional currents so that the magnetic fields produced thereby in the magnetic circuit all have the same sense.

4. An apparatus as claimed in claim 3 wherein the magnetic circuit comprises a core of magnetic material having an air gap in which the Hall effect device is located, and wherein each energizing conductor comprises a winding on said magnetic core, the windings being substantially identical.

* * * * *